United States Patent
Naughton et al.

(10) Patent No.: US 9,912,149 B2
(45) Date of Patent: Mar. 6, 2018

(54) LIGHTNING AND SURGE PROTECTION FOR ELECTRONIC CIRCUITS

(71) Applicants: Thomas P. Naughton, Groton, MA (US); David S. Pinney, Westford, MA (US)

(72) Inventors: Thomas P. Naughton, Groton, MA (US); David S. Pinney, Westford, MA (US)

(73) Assignee: Sensomatic Electronics, LLC, Boca Raton, FL (US)

( * ) Notice: Subject to any disclaimer, the term of this patent is extended or adjusted under 35 U.S.C. 154(b) by 557 days.

(21) Appl. No.: 14/573,063

(22) Filed: Dec. 17, 2014

(65) Prior Publication Data

US 2016/0043544 A1    Feb. 11, 2016

Related U.S. Application Data

(60) Provisional application No. 62/033,714, filed on Aug. 6, 2014.

(51) Int. Cl.
  *H02H 9/00* (2006.01)
  *H02H 9/04* (2006.01)
  *H03K 5/24* (2006.01)

(52) U.S. Cl.
  CPC .............. *H02H 9/04* (2013.01); *H02H 9/045* (2013.01); *H03K 5/2463* (2013.01)

(58) Field of Classification Search
  CPC ........................................................ H02H 9/04
  USPC ........................................................... 361/56
  See application file for complete search history.

(56) References Cited

U.S. PATENT DOCUMENTS

| | | | | |
|---|---|---|---|---|
| 4,449,157 A | * | 5/1984 | Chow | H02H 9/04 330/207 P |
| 4,849,846 A | * | 7/1989 | Hung | H04M 3/18 361/111 |
| 5,229,909 A | | 7/1993 | Tessmer et al. | |
| 5,777,868 A | * | 7/1998 | Gibboney, Jr. | H01R 13/6675 363/126 |
| 6,377,434 B1 | | 4/2002 | Martineau et al. | |
| 7,515,391 B2 | * | 4/2009 | Casey | H04M 3/18 361/111 |
| 2007/0003055 A1 | | 1/2007 | Bark et al. | |
| 2012/0002666 A1 | | 1/2012 | Miller, III et al. | |

OTHER PUBLICATIONS

International Search Report & Written Opinion, PCT/US2015/043561.

\* cited by examiner

*Primary Examiner* — Stephen W Jackson
(74) *Attorney, Agent, or Firm* — Fish & Richardson P.C.

(57) ABSTRACT

Lighting and surge protection circuitry for protection of a differential pair includes a diode bridge circuit having a first pair and a second pair of connections to the diode bridge circuit, with the first pair of connections configured to be coupled to a pair of differential inputs of a functional circuit and a first diode coupled between the second pair of connections; and second and third diodes coupled between the first pair of connections and ground. The lighting and surge protection circuitry also includes a diode pair coupled between an output of the functional circuit being protected and power and ground terminals and a small resistance in series with the output of the functional circuit.

16 Claims, 4 Drawing Sheets

LIGHTNING AND SURGE PROTECTION FOR ELECTRONIC CIRCUITS

This application claims priority under 35 U.S.C. § 119 to U.S. Provisional Patent Application Ser. No. 62/033,714, filed Aug. 6, 2014, and entitled "Lightning and Surge Protection for Electronic Circuits", the entire contents of which are hereby incorporated by reference.

BACKGROUND

This description relates to operation of electronic systems in particular surge protection of circuits and systems.

One troublesome source of voltage surges result from lighting strikes. Lighting is a perplexing source of surges because a lighting strike can induce very high energy into a circuit at a very high rise time (on the order of microseconds). Microelectronic Integrated Circuits (MIC's) especially those that operate with low voltages and/or have field effect transistors on input lines are also susceptible to damage from electrostatic discharge such as static electricity that comes from improper handling and voltage surges.

Underwriter Laboratories, Inc. (UL) has promulgated standards UL-1076 (Proprietary Burglar Alarm Systems) and UL-294 (Access Control) to define a level of surge suppression performance expected for high security facilities. These UL standards define test requirements of multiple surges that are injected into all I/O ports on a device. The UL Transient Test Requirements (as defined in UL-1076) tests are generally set out below, in relevant part:

44.4.3 For this test, each input/output circuit is to be subjected to five different transient waveforms having peak voltage levels in the range of 100 to 2400 volts, as delivered into a 200-ohm impedance. A transient waveform at 2400 volts shall have a pulse rise time of 100 volts per microsecond, and a pulse decay duration of approximately 80 microseconds, which is generating an energy level of over 1.2 joules. Other applied transients shall have peak voltages representative of the entire range of 100 to 2400 volts, with pulse durations from 80 to 110 microseconds, and energy levels not less than 0.3 joule or greater than 1.2 joules and to a maximum of approximately 1.2 joules. The transient pulses are to be coupled directly into each individual input/output circuit conductor to earth ground and to all combinations within a connector of the equipment under test.

44.4.4 The equipment is to be subjected to 60 transient pulses induced at a maximum rate of six pulses per minute as follows:

a) Twenty pulses (two at each transient voltage level specified in 44.4.3) between each input/output circuit lead or terminal and earth ground, consisting of ten pulses of one polarity, and ten of the opposite polarity (total of 40 pulses) and b) Twenty pulses (two at each transient voltage level specified in 44.4.3) between any two input/output circuit leads or terminals consisting of ten pulses of one polarity and ten pulses of the opposite polarity.

SUMMARY

High speed circuits such as Ethernet circuits need to balance competing requirements of low signal distortion levels to enable high data rates, and yet have the ability to survive hostile environmental conditions such as power line and lighting surges as typified by the above UL standards and electrostatic discharge (ESD) and other induced power transients. This is especially critical for security equipment that could pose a safety and security risk if the equipment failed during such an environmental event.

The UL defined test for the Surge and Lightning Transient Test injects the surges (maximum of 2400V, 1.2 Joules) into each connector pin to ground and into every pin to pin combination of a port/connector. For an Ethernet RJ-45 port, for example, 1.2 Joules of energy are injected into a very sensitive circuit that uses microelectronic integrated circuits that operate at 3.3V supply voltage levels and that requires signal lines to have less than 5 pF (pico farads) of capacitance. These conditions present conflicting requirements of low voltage signaling at low capacitance vs. an ability of the circuit to safely handle occasional high energy surges.

According to an aspect, a circuit includes a diode bridge circuit having a first pair and a second pair of connections to the diode bridge circuit, with the first pair of connections configured to be coupled to a pair of differential inputs of a functional circuit, a first diode coupled between the second pair of connections, and second and third diodes coupled between the first pair of connections and ground.

The following are some embodiments within this aspect.

The diodes in the diode bridge circuit are surge suppression diodes, and the first diode, second and third diodes are Transzorb diodes. The circuit further includes a diode pair coupled between an output of the functional circuit and power and ground terminals, having a first diode of the diode pair having a cathode coupled to ground and an anode coupled to power and having a second diode of the diode pair having a cathode coupled to power and an anode coupled to ground. The circuit further includes a device coupled in series with outputs of the functional circuit to insert a small resistance in series with the output of the functional circuit. The device coupled in series is either a resistor that has a resistance in a range of 2 to 10 ohms or a surge suppression IC that under normal conditions inserts about 5Ω of impedance and opens under high current conditions. The circuit further includes a diode pair coupled between an output of the functional circuit and power and ground terminals, having a first diode of the diode pair having a cathode coupled to ground and an anode coupled to power and having a second diode of the diode pair having a cathode coupled to power and an anode coupled to ground and a device coupled in series with outputs of the functional circuit to insert a resistance in a range of 2 to 10 ohms in series with the output of the functional circuit.

According to an additional aspect, a circuit arrangement includes a substrate supporting a surge protection circuit that includes a diode bridge circuit having a first pair and a second pair of connections, with the first pair of connections configured to couple to a pair of differential inputs of a functional circuit, a first diode coupled between the second pair of connections, second and third diodes coupled between the first pair of connections and ground, and the substrate further supporting a surge steering circuit that includes a diode pair coupled between an output of the functional circuit and power and ground terminals, the diode pair having a first diode of the diode pair having a cathode coupled to ground and an anode coupled to power and having a second diode of the diode pair having a cathode coupled to power and an anode coupled to ground.

The following are some embodiments within this aspect.

The circuit arrangement further includes a device coupled in series with outputs of the functional circuit to insert a small resistance in series with the output of the functional circuit. The diodes in the diode bridge circuit are surge suppression diodes, and the first diode, second and third diodes are Transzorb diodes and diodes in the diode pair are Zener, transient voltage suppression or Transzorb diodes. The substrate is part of an integrated circuit and the surge protection circuit and the surge steering circuit are fabricated as part of the integrated circuit. The substrate is part of a circuit board and the surge protection circuit and the surge steering circuit are on the printed circuit board. The circuit arrangement further includes the functional circuit that is an interface circuit coupled to the surge protection circuit and the surge steering circuit.

According to an additional aspect, a circuit arrangement includes a substrate supporting a surge protection circuit that includes a diode bridge circuit having a first pair and a second pair of connections, with the first pair of connections configured to be coupled to a pair of differential inputs of an interface circuit, a first diode coupled between the second pair of connections, second and third diodes coupled between the first pair of connections and ground, and the substrate further supporting a surge steering circuit that includes a diode pair coupled between a pair of differential outputs of the interface circuit and power and ground terminals, the diode pair having a first diode of the diode pair having a cathode coupled to ground and an anode coupled to power and having a second diode of the diode pair having a cathode coupled to power and an anode coupled to ground, the substrate further supporting a surge absorbing circuit that includes a device coupled in series with outputs of the interface circuit to insert a small resistance in series with the output of the interface circuit and the interface circuit that comprises a transformer having an input side coupled to the pair of differential inputs and an output side having the differential outputs coupled to the diode pair.

The following are some embodiments within this aspect.

The diodes in the diode bridge circuit are surge suppression diodes, and the first diode, second and third diodes are Transzorb diodes and diodes in the diode pair are Zener, transient voltage suppression or Transzorb diodes. The substrate is part of an integrated circuit and the surge protection circuit, the surge steering circuit, and the surge absorption circuit are fabricated as part of the integrated circuit. The substrate is part of a circuit board circuit and the surge protection circuit, the surge steering circuit, and the surge absorption circuit are fabricated as part of the integrated circuit. The circuit arrangement further includes the functional circuit that is coupled to the surge protection circuit and the surge steering circuit.

One or more of the above aspects may provide one or more of the following advantages.

A circuit is disclosed that exhibits a very low capacitance under normal conditions but, when subjected to high energy surges, activates to perform shunting, surge steering and absorption functions so to protect critical circuits, such as low energy circuitry, e.g., low energy Ethernet 10/100/1000 Mbit Ethernet, e.g., BASE T, TX, etc. The protection circuit protects sensitive electronic circuits such as 10/100/1000 Ethernet circuits as well as Power over Ethernet (PoE) circuits. PoE is any of several systems that pass electrical power along with data on Ethernet cabling. The surge protection circuit is capable of successfully passing the UL Lightning Simulation Test, discussed above. Various types of sensitive circuits can be protected with one or more or the combination of the features described herein.

The details of one or more embodiments of the invention are set forth in the accompanying drawings and the description below. Other features, objects, and advantages of the invention are apparent from the description and drawings, and from the claims.

DETAILED DESCRIPTION

Figure 1:
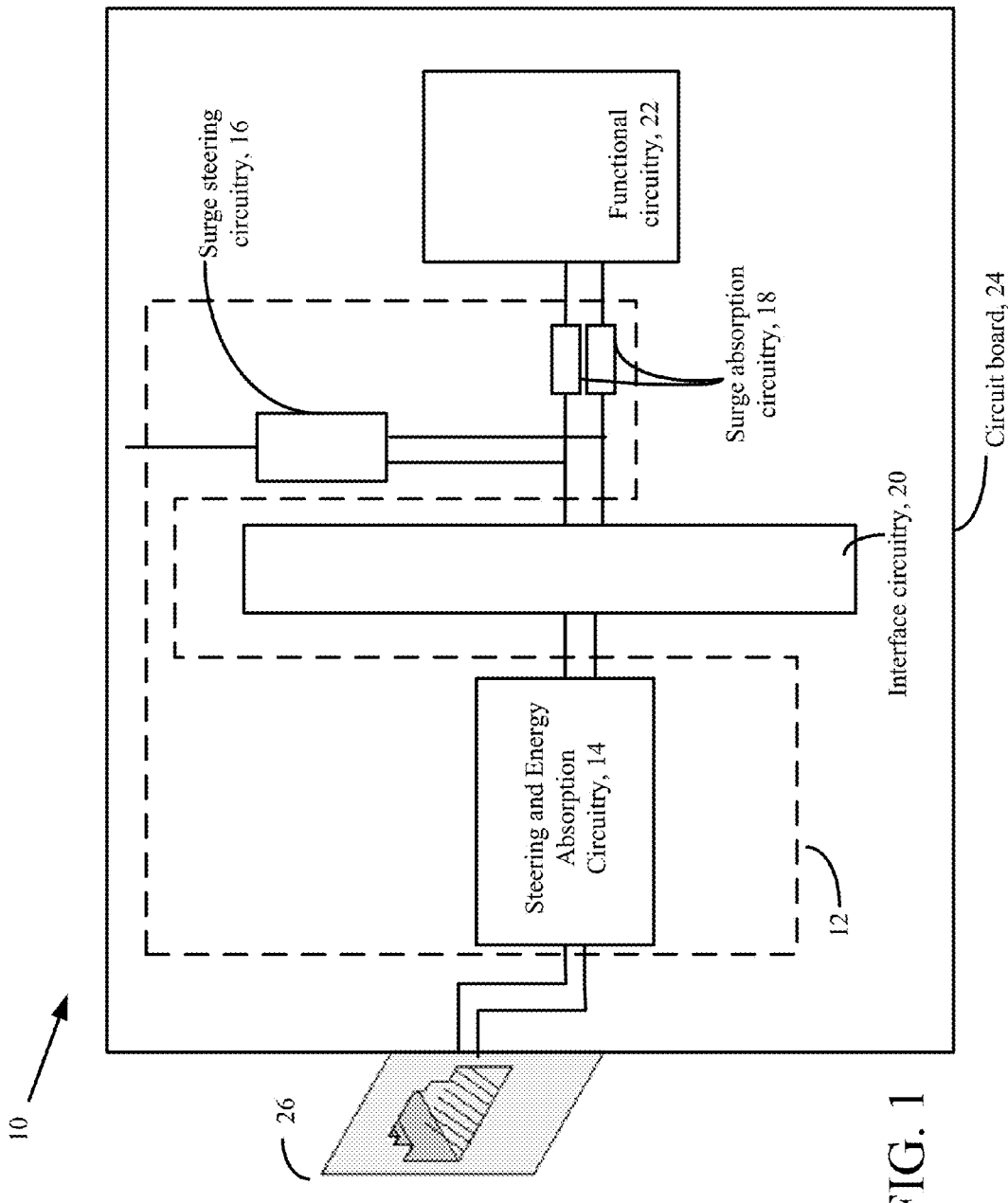
FIG. 1 is a block diagram of a circuit arrangement.

Referring now to FIG. 1, a circuit arrangement 10 is shown. The circuit arrangement 110 can be of any functional arrangement. An example circuit arrangement 10 is circuitry that receives differential input signals using a twisted wire pair. One specific example is circuitry operating under an Ethernet protocol. The circuit arrangement 10 includes surge protection circuitry 12 including a steering and energy absorption circuit 14, a surge steering circuit 16 and a surge absorption circuitry 18 (enclosed in the dash lines). The circuit arrangement 10 also includes interface circuitry 20 that receives the differential input signals. For circuitry operating under an Ethernet protocol the interface/transformer circuitry 20 is magnetic isolation circuitry (including transformers not referenced) and functional circuitry, such as digital, functional circuitry 22 coupled to the magnetic isolation circuitry 20.

The surge protection circuitry 12 is fabricated on a circuit board 24, e.g., a printed circuit board using discrete components or integrated components or can be fabricated as a microelectronic integrated circuit on a substrate. The surge protection circuitry 12 is configured to receive the magnetic isolation circuitry 20, and the digital functional circuitry 22 as part of the circuit arrangement 10.

The circuit arrangement 10 receives at least one and generally several differential pair signal conductors, such as shown diagrammatically by the heavy lines, emanating from an Ethernet connector jack 26. The surge protection circuitry 12 protects the differential signal lines that feed the magnetic isolation circuit 20. The surge protection circuitry 12 is coupled to input/output ports on the magnetic isolation circuit 20 to protect such circuit 20 as well as digital functional circuitry coupled to the magnetic isolation circuit 20 from surges on the input differential lines.

The description of the surge protection circuitry 12 will be explained in conjunction with protecting an Ethernet RJ-45 port. However, other circuitry that uses differential pairs can be protected by the surge protection circuitry 12. In addition, in the description specific components have been identified. However, the surge protection circuitry can use other types of components that provide similar functional characteristics to those described below.

Figure 2:
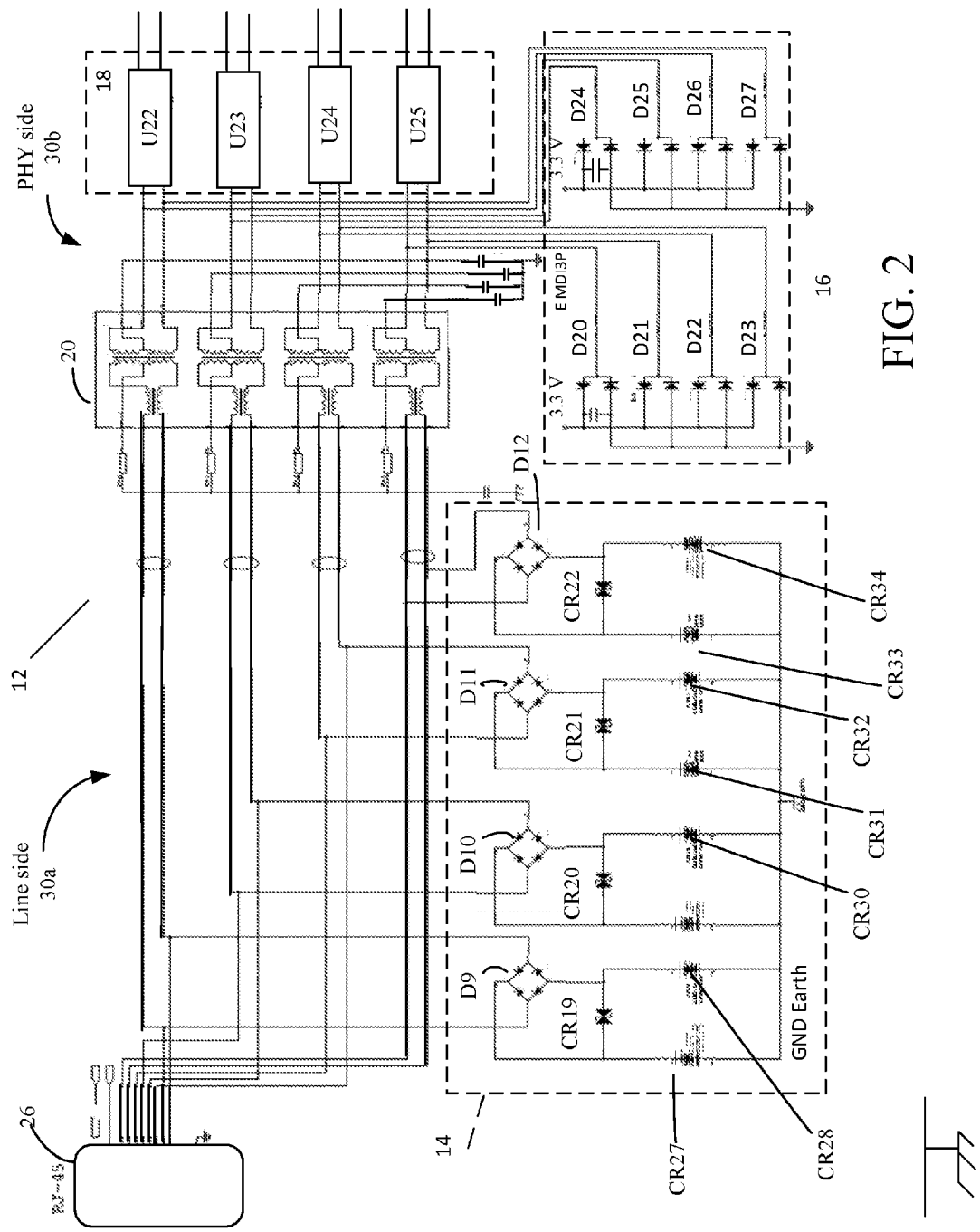
FIGS. 2-4 are schematic diagrams for aspects of surge protection circuitry useful for protection of functional circuits in the arrangement of FIG. 1.

Referring now to FIG. 2, the surge suppression circuitry 12 includes circuitry for protection of the line side 30a and circuitry for protection of the physical (PHY) side 30b of the magnetic isolation circuitry 20. The magnetic isolation circuitry 20 is a set of transformers that generally receive the differential signal pair inputs from the connector and are typically required of certain standards such as the IEEE Ethernet 10/100/1000 Mbit BASE T, TX, standards.

As also shown in FIG. 2, the line side circuitry 30a includes for each differential input pair of lines (denoted by small ellipses enclosing line pairs), a diode bridge (here an SR70-02C) delineated as diode bridges D9, D10, D11 & D12 and 54V transient voltage suppressors (Transzorbs SMBJ54CA) delineated as diodes CR27, CR28, CR29, CR30, CR31, CR32, CR33 and CR34 that couple the diode bridges to ground. Coupled between pairs of the Transzorb CR27, CR28, CR29, CR30, CR31, CR32, CR33 and CR34 are 7.5 transient voltage suppressors C19-C23 (Transzorbs SMBJ7.5CA).

The exemplary diode bridge is provided by (SR70-02C) diode array. The SR70 is a lighting suppression diode array having four, low capacitance, rail-to-rail diodes that provide protection against ESI) and lightning surge events. A Transzorb "transient-voltage-suppression (TVS) diode" is an electronic component to protect electronics from voltage spikes induced on connected wires that steers excess energy to ground and provides energy absorption when the input voltage exceeds an avalanche breakdown voltage potential of the diode, and clamps the voltage to the avalanche breakdown voltage, thus suppressing voltages above the breakdown voltage.

The Transzorbs in these operations have been selected to be 54V (which will turn on at ~60V) so to be high enough to allow either Ethernet or PoE voltages to proceed unhindered under normal conditions. For the circuit arrangement in FIG. 1, where the ports are RJ45 Ethernet ports, 7.5V Transzorbs are chosen as this value provides a suitable tradeoff of voltage vs. speed. The lower the Transzorb voltage the more junction capacitance, which makes the device slow to initially turn on. The 7.5V balances a requirement of relatively fast speed to turn on with suitable voltage clipping or truncating.

In FIG. 2, transient voltage suppressor CR19 is coupled between Transzorbs CR27 and CR28; transient voltage suppressor CR20 is coupled between Transzorbs CR29 and CR30; transient voltage suppressor CR21 is coupled between Transzorbs CR31 and CR32; and transient voltage suppressor CR22 is coupled between Transzorbs CR33 and CR34. The SMBJ series are 600 Watt transient voltage suppressors that come in various reverse breakdown voltages. For example, the 7.5V transient voltage suppressors have breakdown voltages between about 8.33 and 9.21V, whereas the 54V transient voltage suppressors have breakdown voltages between about 60 and 66.3V.

The 54V Transzorbs exhibit low capacitance in comparison to the 7.5V Transzorbs. The 54V Transzorbs however do not turn on until about a 60V surge is reached. PoE voltage is a maximum of 58V; so the 54V Transzorbs will not activate with PE voltages being present.

The PHY side 30b includes surge steering circuitry 16 including steering diode pairs D20-D27, e.g., Zener diodes or Transzorbs or TVS (transient voltage suppressor diodes having one end coupled respectively between either power or ground and an output from the magnetic isolation circuitry. Thus, as shown for example in FIG. 2, Diode pair D20 has first ends of each diode in the diode pair D20 coupled to a signal line "E MDI3P" (an Ethernet signal) with second ends of each diode in the diode pair D20 coupled to either power or ground. A similar arrangement is provided for diode pair D21, as shown and similar arrangements are provided for diode pairs D23 to D27. The steering diodes D20-D27 connected to signal lines.

Figure 4:
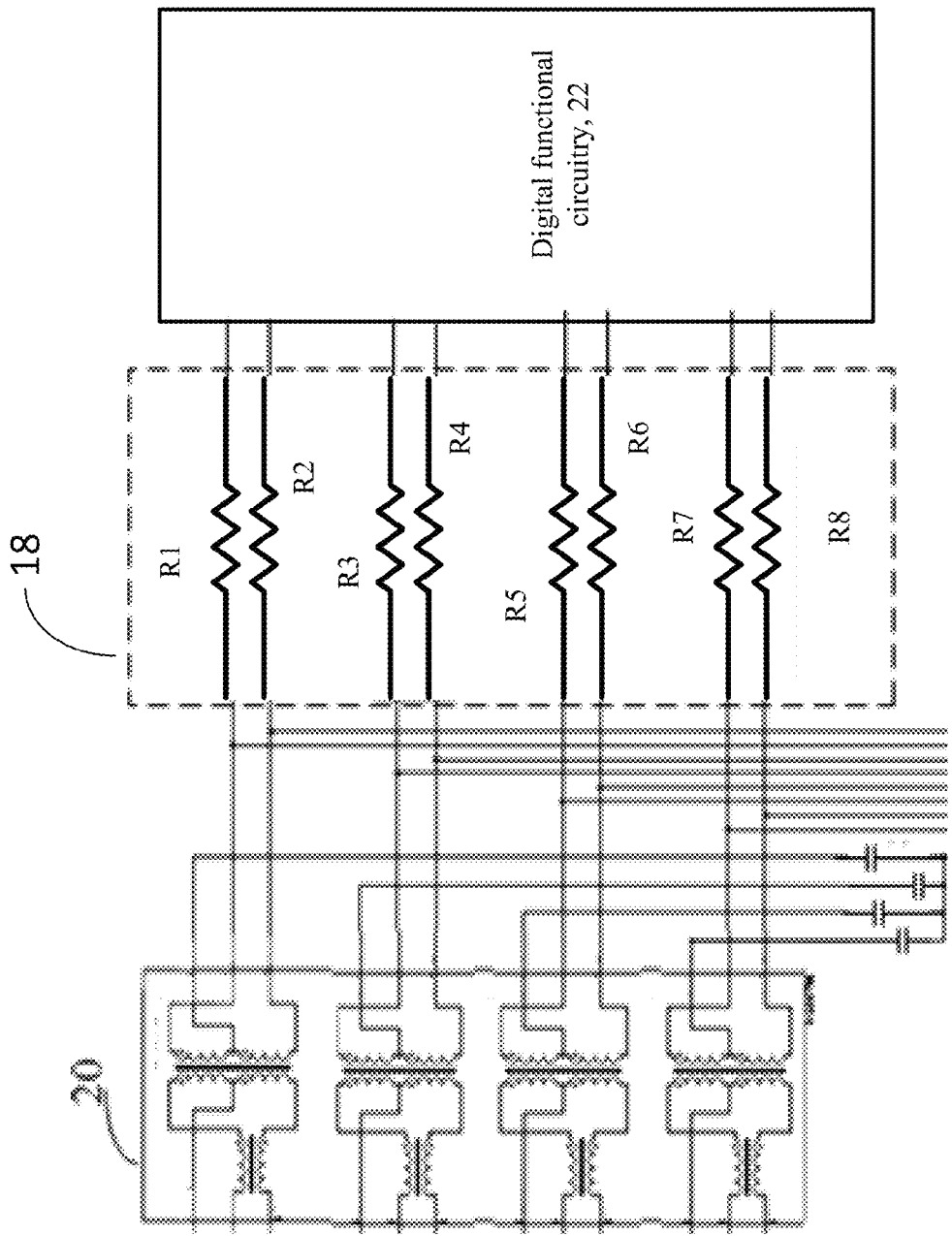

Also on the PHY side there is the surge absorption circuitry 18 here devices U22 through U25. In some implementations devices U22 through U25 are exchanged with a low value series resistance, e.g., about 2.5 to 10 ohms in those signal lines. One implementation of devices U22 through U25 is as a resistor (as shown in FIG. 4). In another implementation the devices U22 to U25 are surge suppression integrated circuits such as a (TCS-DL004-250) obtained from Bourns Electronic Solutions which under normal conditions inserts about 5 ohms of impedance and opens under high current conditions. The TCS-DL004-250 is but one alternative to the resistor, other components that provide a small series resistance on each line in the differential line pair could be used. Some applications of the surge protection circuitry need not use the devices U22 through U25 as such applications could have characteristics that allow it to handle any harmful energy that is not steered away by the steering diode pairs D20-D27, e.g., some implementations of Ethernet circuitry for 10/100 Mbit Ethernet.

Under normal operating conditions the protection circuit 12 is in a tow capacitance state. On the line side 30a the steering and energy absorption circuit 14 is not activated, as voltages on input lines from the connector 26 coupled to the diode bridges D9, D10, D11 & D12 are not sufficient to forward bias the bridge diodes so steering and energy absorption circuit 14 of the protection circuitry 12 is isolated, with the line side signaling only experiencing the bridges' low junction capacitance. On the PHY side 30b steering diodes in the diode pairs D20 through D27 (CD-SOT23-S2004) likewise are not forward biased similar to the bridge diodes on the line side 30a. The diodes in the diode pairs D20 through D27 have a relatively low capacitance (typically 3 pF up to about 5 pF) and these diodes in the diode pairs D20 through D27 start conduction at voltages as low as 3.3V. The PHY side also has capacitors on the 3.3V lines to help absorb surge energy. On the PHY side, the PHY side signal voltage levels are low enough so as not to forward bias any of the steering diodes in diode pairs D20 through D27, again isolating the steering diode protection circuitry from the PHY side, with the signals at the output of the magnetic coupling circuitry only experiencing the steering diodes' tow junction capacitance (typically 3.5 pF).

Also on the PHY side 30b devices U22 through U25 present a low value series resistance, e.g., less than 10 ohms, for example about 2.5 to 10 ohms or typically about 5 ohms on each line. However, slightly higher values of series resistance could be used in some applications.

Figure 3:
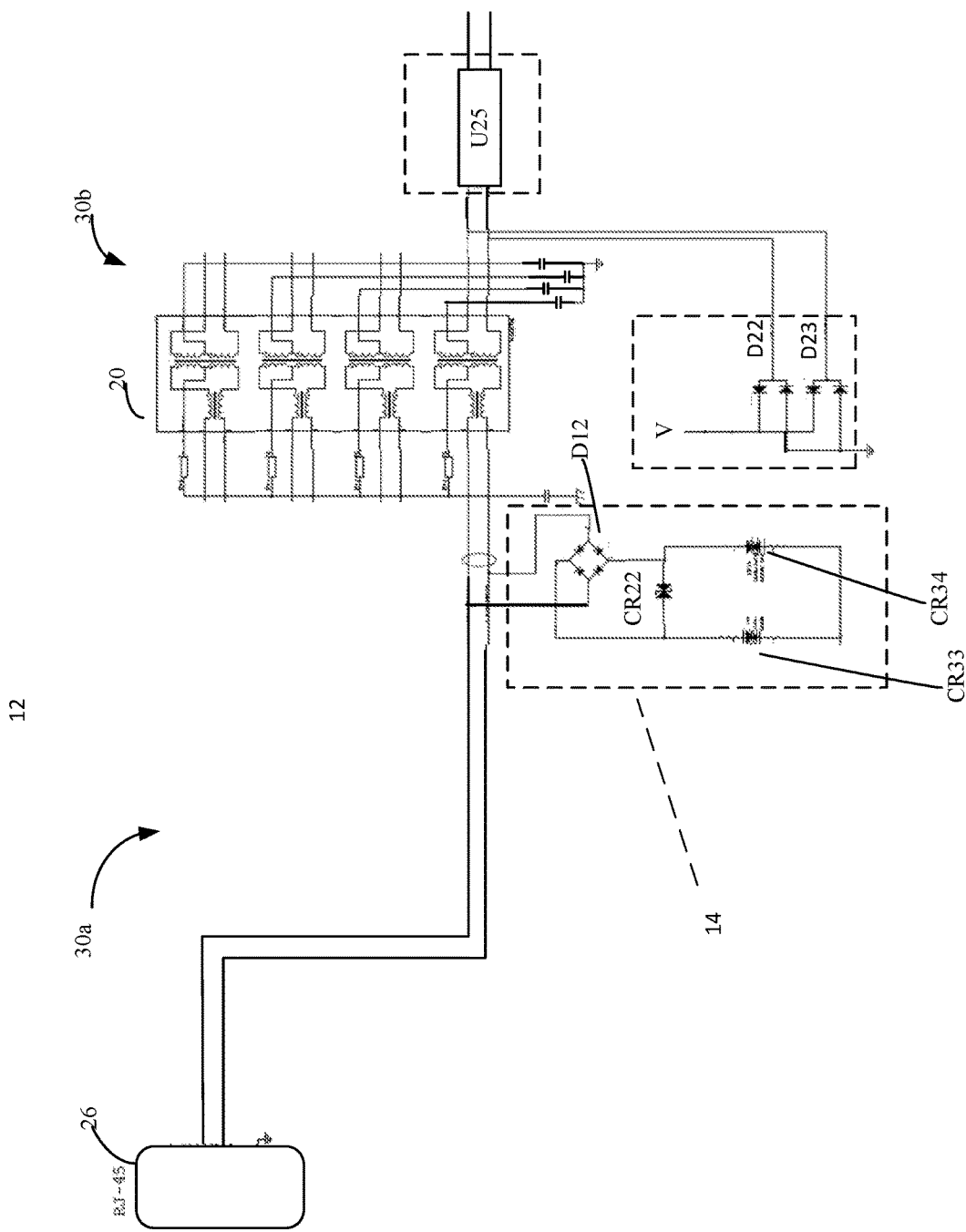

Referring now to FIG. 3, the surge suppression circuitry 12 is shown for protection of the line side via steering and energy absorption circuit 14 and circuitry for protection of the physical (PHY) side of the magnetic isolation circuitry T1 via surge steering circuitry 14 for a single channel. Under normal operating conditions the protection circuit 12 is in a low capacitance state. On the line side 30a the steering and energy absorption circuit 14 is not activated, as voltages on input lines from the connector 26 coupled to the diode bridge D12 are not sufficient to forward bias diodes in the diode bridge D12 so steering and energy absorption circuit 14 of the protection circuitry 12 is isolated, with the line side signaling only experiencing the bridges' low junction capacitance. Also, on the PHY side 30b steering diodes in the diode pair D22 through D23 likewise are not forward biased.

Referring now to FIG. 4, surge absorption circuitry 18 of the surge suppression circuitry is shown for protection of the physical (PHY) side of the magnetic isolation circuitry T1. In this embodiment the surge absorption circuitry 18 uses discrete resistors R1-R6 placed in each of the output differential pair lines that feed signals to the functional circuitry 22 (see also FIG. 1) on each channel. These resistors have a low resistance of, e.g., less than 10 ohms, e.g., about 2.5 to 10 ohms or typically about 5 ohms.

Circuit Operation under Surge to Ground

Referring now back to FIGS. 1 and 2, when using an interface to an Ethernet RJ-45 Port, as an example, ports 1 through 8 are subjected to a surge to ground. The Line Side 30a diode bridges D9, D10, D11 & D12 become forward biased, and the surge energy will be suppressed by being diverted to ground through a 54V Transzorb. This path will divert such damaging energy away from the magnetic coupled interface 20 to ground and thus bypassing Ethernet circuitry such as in FIG. 1

Circuit Operation under Surge on RJ-45 Pin to Pin (Not on Common Transformer Winding)

When a surge is experienced between RJ-45 pins that are not on a common Ethernet transformer winding, the surge is steered though the Line Side Diode Bridge (one of the bridges D9, D10, D11 or D12 (SR70-02C)) to the accompanying Transzorb (CR27, CR28, CR29, CR30, CR31, CR32, CR33 or CR34) to ground. From ground the circuit path will continue to the Transzorb and bridge that are connected to the other pin that the surge is being injected into. In this path the two forward biased Bridges will steer the surge to the two associated Transzorbs and the two Transzorbs will dissipate the energy of the surge.

Circuit Operation under Surge on RJ-45 Pin to Pin (On Common Transformer Winding)

This is a special condition when a differential surge is experienced on the Ethernet differential pairs. Ethernet differential pairs are very sensitive because all differential energy will be transmitted through the Ethernet Transformer directly into the Physical Interface (PHY) (i.e., the functional circuits 22 in FIG. 1).

In some implementations the Ethernet differential pairs on the RJ-45 connector are as follows:

RJ-45 Pin 1 & Pin 2
RJ-45 Pin 3 & Pin 6
RJ-45 Pin 4 & Pin 5
RJ-45 Pin 7 & Pin 8

When a surge occurs on a differential pair that are on a common transformer winding, e.g., any of ports identified in FIG. 2, a corresponding one of the line side diode bridges (i.e., one of the bridges D9, D10, D11 or D12 (SR70-02C)) will conduct into its accompanying 7.5V Transzorb (CR19, CR20, CR21 & CR22). The accompanying 7.5V Transzorb (CR19, CR20, CR21 or CR22) will absorb a large percentage of the surge. However there will still be some differential energy that will be transmitted though the corresponding transformer to the PHY side 30b.

On the PHY side 30b are placed the steering diodes D20, D21, D22, D23, D24, D25, D26 & D27 (CDSOT23-S2004) that steer energy that exceeds 3.3V (plus a diode junction voltage drop) or below ground (minus a diode junction voltage drop) to the 3.3V power supply (not shown) via power lines 3.3 V or ground. The CDSOT23-S2004 diodes have very low capacitance of about 3 pF. Any energy that is not steered to the 3.3V power supply will be impeded by the series impedance of e.g., less than 10 ohms, e.g., about 2.5 to 10 ohms or typically about 5 ohms provided either by the series resistor or the over current protection IC U22, U23, U24 or U25 (TCS-DL004-250).

Other embodiments are within the scope and spirit of the description claims. For example, due to the nature of the example circuit described, there is a need for low capacitance. For other implementations to protect sensitive circuits the need for low capacitance may not be as important and thus higher capacitance components could be used. On the other hand in other implementations to protect sensitive circuits even lower capacitance may be needed and thus lower capacitance components would be used. In addition, current circuit voltages, e.g., on the PHY side are 3.3V. However, in the future these voltages could be lower and thus there would be a concomitant modification of values, e.g., conduction and breakdown voltages and junction capacitances of the components. Other embodiments are within the scope of the following claims.

What is claimed is:

1. A circuit comprises:
    a diode bridge circuit having surge suppression diodes and a first pair of connections and a second pair of connections to the diode bridge circuit, with the first pair of connections configured to be coupled to a pair of differential inputs of a functional circuit;
    a first Transzorb diode coupled between the second pair of connections; and
    second and third Transzorb diodes with the second Transzorb diode coupled between a first one of the second pair of connections and ground, and with the third Transzorb diode coupled between a second one of the second pair of connections and ground.

2. The circuit of claim 1, further comprising:
    a diode pair coupled between an output of the functional circuit and power and ground terminals, having a first diode of the diode pair having a cathode coupled to ground and an anode coupled to power and having a second diode of the diode pair having a cathode coupled to power and an anode coupled to ground.

3. The circuit of claim 1, further comprising:
    a device coupled in series with outputs of the functional circuit to insert a small resistance in series with the output of the functional circuit.

4. The circuit of claim 3 wherein the device coupled in series is either a resistor that has a resistance in a range of 2 to 10 ohms or a surge suppression IC that under normal conditions inserts about 5 ohms of impedance and opens under high current conditions.

5. The circuit of claim 1, further comprising:
    a diode pair coupled between an output of the functional circuit and power and ground terminals, having a first diode of the diode pair having a cathode coupled to ground and an anode coupled to power and having a second diode of the diode pair having a cathode coupled to power and an anode coupled to ground; and
    a device coupled in series with outputs of the functional circuit to insert a resistance in a range of 2 to 10 ohms in series with the output of the functional circuit.

6. A circuit arrangement comprises:
    a substrate supporting a surge protection circuit that comprises:
        a diode bridge circuit having a first pair and a second pair of connections, with the first pair of connections configured to couple to a pair of differential inputs of a functional circuit;
        a first diode coupled between the second pair of connections;
        second and third diodes coupled between the second pair of connections and ground; and
    the substrate further supporting a surge steering circuit that comprises:
        a diode pair coupled between an output of the functional circuit and power and ground terminals, the diode pair having a first diode of the diode pair having a cathode coupled to ground and an anode coupled to power and having a second diode of the diode pair having a cathode coupled to power and an anode coupled to ground.

7. The circuit arrangement of claim 6, further comprising:
a device coupled in series with outputs of the functional circuit to insert a small resistance in series with the output of the functional circuit.

8. The circuit arrangement of claim 6 wherein diodes in the diode bridge circuit are surge suppression diodes, and the first diode, second and third diodes are Transzorb diodes and diodes in the diode pair are Zener, transient voltage suppression or Transzorb diodes.

9. The circuit arrangement of claim 6 wherein the substrate is part of an integrated circuit and the surge protection circuit and the surge steering circuit are fabricated as part of the integrated circuit.

10. The circuit arrangement of claim 6 wherein the substrate is part of a circuit board and the surge protection circuit and the surge steering circuit are on the printed circuit board.

11. The circuit arrangement of claim 6, further comprising the functional circuit that is an interface circuit coupled to the surge protection circuit and the surge steering circuit.

12. A circuit arrangement comprises:
a substrate supporting a surge protection circuit that comprises:
a diode bridge circuit having a first pair and a second pair of connections, with the first pair of connections configured to be coupled to a pair of differential inputs of an interface circuit;
a first diode coupled between the second pair of connections;
second and third diodes coupled between the first pair of connections and ground; and
the substrate further supporting a surge steering circuit that comprises:
a diode pair coupled between a pair of differential outputs of the interface circuit and power and ground terminals, the diode pair having a first diode of the diode pair having a cathode coupled to ground and an anode coupled to power and having a second diode of the diode pair having a cathode coupled to power and an anode coupled to ground;
the substrate further supporting a surge absorbing circuit that comprises:
a device coupled in series with outputs of the interface circuit to insert a small resistance in series with the output of the interface circuit; and
the interface circuit that comprises a transformer having an input side coupled to the pair of differential inputs and an output side having the differential outputs coupled to the diode pair.

13. The circuit arrangement of claim 12 wherein diodes in the diode bridge circuit are surge suppression diodes, and the first diode, second and third diodes are Transzorb diodes and diodes in the diode pair are Zener, transient voltage suppression or Transzorb diodes.

14. The circuit arrangement of claim 12 wherein the substrate is part of an integrated circuit and the surge protection circuit, the surge steering circuit, and the surge absorption circuit are fabricated as part of the integrated circuit.

15. The circuit arrangement of claim 12 wherein the substrate is part of a circuit board circuit and the surge protection circuit, the surge steering circuit, and the surge absorption circuit are fabricated as part of the integrated circuit.

16. The circuit arrangement of claim 6, further comprising the functional circuit that is coupled to the surge protection circuit and the surge steering circuit.

* * * * *